United States Patent
Bernstein et al.

(10) Patent No.: US 6,191,628 B1
(45) Date of Patent: Feb. 20, 2001

(54) CIRCUIT FOR CONTROLLING THE SLEW RATE OF A DIGITAL SIGNAL

(75) Inventors: Kerry Bernstein, Underhill; Edward J. Nowak, Essex Junction; Norman J. Rohrer, Underhill, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/224,763

(22) Filed: Jan. 4, 1999

(51) Int. Cl.<sup>7</sup> ....................................... H03K 5/12
(52) U.S. Cl. ................................. 327/170; 327/134
(58) Field of Search ............................ 327/134, 170, 327/91, 94, 108, 111, 112, 379, 380, 381, 263, 264, 268; 326/87

(56) References Cited

U.S. PATENT DOCUMENTS

| | | | |
|---|---|---|---|
| 4,622,482 | 11/1986 | Ganger | 307/585 |
| 4,857,863 | 8/1989 | Ganger et al. | 330/264 |
| 4,952,863 * | 8/1990 | Sartwell et al. | 327/170 |
| 5,023,472 * | 6/1991 | Hashimoto et al. | 327/108 |
| 5,107,153 * | 4/1992 | Osaki et al. | 327/264 |
| 5,111,085 | 5/1992 | Stewart | 307/603 |
| 5,220,209 * | 6/1993 | Seymour | 326/87 |
| 5,220,216 | 6/1993 | Woo | 307/469 |
| 5,459,424 | 10/1995 | Hattori | 327/278 |
| 5,469,096 | 11/1995 | Nessi et al. | 327/112 |
| 5,495,199 | 2/1996 | Hirano | 327/337 |
| 5,517,142 * | 5/1996 | Jang et al. | 327/108 |
| 5,534,819 * | 7/1996 | Gunter et al. | 327/391 |
| 5,537,067 | 7/1996 | Carvajal et al. | 327/108 |
| 5,619,147 | 4/1997 | Hunley | 326/26 |
| 5,642,067 | 6/1997 | Grace | 327/130 |
| 5,734,277 * | 3/1998 | Hu et al. | 327/108 |
| 5,742,193 | 4/1998 | Colli et al. | 327/170 |

* cited by examiner

*Primary Examiner*—Toan Tran
(74) *Attorney, Agent, or Firm*—Pollock, Vande Sande & Amernick, RLLP; Eugene I. Shkurko, Esq.

(57) ABSTRACT

A circuit for selectively controlling the slew rate of a signal on a data line. A capacitor is connected at one end to a common terminal of a power supply and to a switching circuit. The switching circuit advantageously connects the capacitor to the data line in response to a control pulse, capacitively loading the data line so that slew rate is decreased. When the control pulse assumes a different state, the capacitor is connected by the switching circuit to a terminal of a power supply, and acts as a decoupling capacitor. The dual role of the capacitor provides for efficient circuit layout by utilizing one component in two functions.

14 Claims, 3 Drawing Sheets

CIRCUIT FOR CONTROLLING THE SLEW RATE OF A DIGITAL SIGNAL

BACKGROUND OF THE INVENTION

The present invention relates to CMOS integrated circuit technology. Specifically, a circuit for implementation in CMOS technology is described which controls the slew rate of pulses on a signal line.

Digital devices such as microprocessor implemented products have time-sensitive signal paths which carry digital signals. Signal transistors comprising a digital signal along a signal path have a unique time synchronization with devices which are connected to the signal paths. One of the ways of controlling the time of arrival of a digital signal on a signal path is to control the slew rate of the signal transitions. A circuit which acts in response to a rising or falling edge of a digital signal transition may have its response delayed by decreasing the slope, or slew rate, of the rising or falling edge of the digital signal.

Various devices have been employed in the prior art to control slew rate by switching in another device in a signal path if the slew rate is too slow, such as is shown in U.S. Pat. No. 5,015,880. Other techniques for controlling slew rate include a feedback method as exemplified in U.S. Pat. No. 5,619,147. The circuits described in these patents are utilized as driver circuits, which match the impedance and reduce reflections of signals which are propagated on a signal path extending off chip, and require additional CMOS transistors to implement the slew rate control.

Slew rate control is required when operating certain CMOS circuits under high stress conditions, such as during Burn-In. During high stress conditions such as Burn-In voltages and temperatures are increased and the digital signal propagation speed and slew rate tends to increase, sometimes interfering with operation of the circuit. Decreasing the slew rate under these circumstances may restore the operation of the circuit.

Control over the slew rate also permits a reduction in noise coupling between signal lines. The faster signal transitions tend to propagate to other signal lines introducing noise on the other signal lines. By reducing slew rates it is possible to decrease this particular source of noise.

SUMMARY OF THE INVENTION

It is an object of this invention to provide a circuit which can controllably alter the slew rate of a signal propagating on a data line.

In accordance with the present invention, a circuit is provided which selectively controls the slew rate of a signal. The circuit includes a switching circuit which is capable of connecting a capacitor to a data line carrying a propagating signal when a control pulse of a first state is received. The capacity added to the data line reduces the slew rate of a propagating signal. In the absence of a control pulse, the switching circuit connects the capacitor to a terminal of a power supply used to supply current to the circuit where it serves as a bypass or decoupling capacitor for the power supply.

Thus, in one state of the control pulse, the slew rate may be advantageously decreased, and in another state of the control pulse, the slew rate is increased and the capacitor serves as a decoupling capacitor for the power supply.

Implementation of the switching circuit is accomplished through a minimum number of components, and may include as few as two field effect transistors which have a common gate connection and common drain connections. A capacitor is connected from the common drain connection to ground, and the source connections of the field effect transistors are connected to a power supply terminal and the data line.

The basic slew rate control device may be implemented in an array to provide binary changes in the slew rate, based on a selective activation of multiple slew rate control devices.

DESCRIPTION OF THE PREFERRED EMBODIMENT

Figure 1:
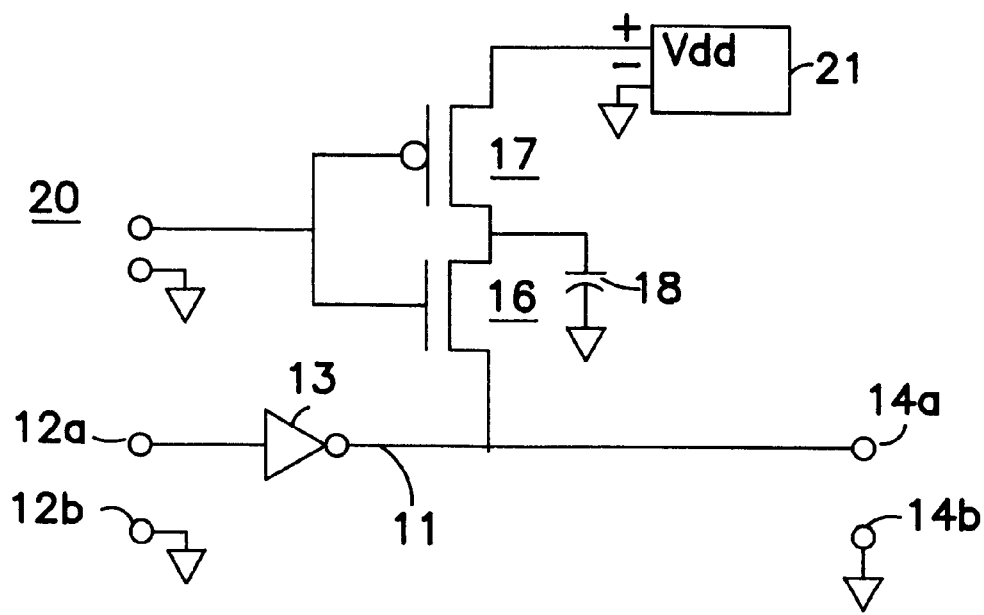
FIG. 1 is a schematic drawing of a preferred embodiment of the slew rate control device in accordance with the invention.

Referring now to FIG. 1, a preferred embodiment of the invention is disclosed which reduces the slew rate of pulses appearing on data line 11. Data line 11 includes input terminals 12 and 12b, output terminals 14 and 14b, and an inverter amplifier 13. Connected to the data line 11 is an N channel field effect transistor (FET) 16, having a drain connection connected to one side of a slew rate control capacitor 18. A second, P channel FET 17 includes a drain connection connected to the capacitor 18, and a source connection connected to the power supply 21 terminal VDD. Capacitor 18 is connected to the data line 11 in response to a pulse received at the control terminal 20 which is connected to the gates of each of N channel FET 16 and P channel FET 17.

The capacitor 18 of FIG. 1 may be implemented from a thin oxide capacitor, a DRAM capacitor or a metal insulator/metal capacitor as is known in CMOS technology.

Figure 2:
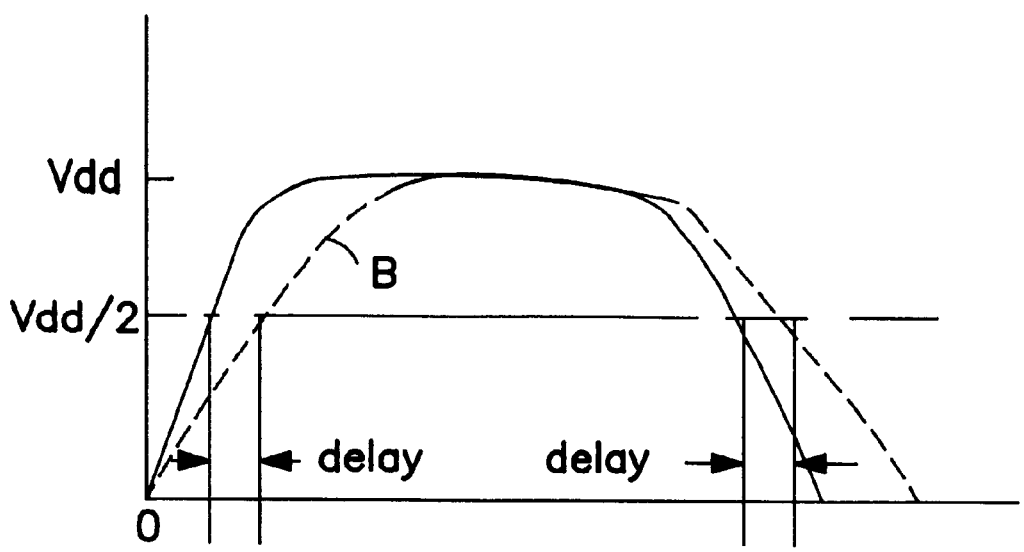
FIG. 2 illustrates the change in slew rate which occurs when the control pulse applied to the slew rate control device changes state.

The effect of capacitor 18 on slew rate for pulses on a data line 11 is illustrated more particularly in FIG. 2. FIG. 2 illustrates the slew rate, when capacitor 18 is not connected to data line 11, as A, and the slew rate B when slew rate is reduced by connecting capacitor 18 to the data line 11 in response to a pulse applied to control input 20. By changing the voltage at control terminal 20, the slew rate can change tens of picoseconds, depending on the value of the slew rate control capacitor 18. The capacitor is sized to provide approximately $10 \times 10^{-12}$ seconds of additional delay on data line 14. The capacitor size is typically in the $10^{-3}$ picofarad range. Thus, a circuit connected to output terminals 14a and 14b would respond more slowly when the slew rate was decreased as shown in B of FIG. 2. The reduction in slope of the pulse waveform appearing on data line 11 increases the time in which it takes to reach one half of the power supply voltage VDD (VDD/2). Level sensitive logic circuits connected to terminals 14a and 14b which switch at VDD/2 levels, accordingly respond later than if the slew rate capacitor 18 is removed from the data line 11. As illustrated in FIG.

2, the time delay effect on the ascending edge of the pulse is matched by an equivalent effect on the descending edge of a data pulse appearing on data line 11.

The circuit of FIG. 1 can be implemented so that the data input terminals 12a, 12b and control terminal 20 are connected together, which will provide for an asymmetric slew rate between leading edge and falling edge of a digital pulse. As the data input signal on terminals 12a, 12b transitions from low to high, the added capacitance of slew rate control capacitor 18 would effectively delay the pulses appearing on data line 11. However, when the input transition is from high to low the capacitor would be switched into a decoupling circuit for the power supply 21. This would provide for less capacitive loading of the data line 11, and therefore result in an asymmetrical slew rate when desired.

Control over the connection of the slew rate control capacitor 18 to the data line 11 results from conduction of N channel FET 16. When the N channel FET 16 is not conducting, due to the level of voltage on control terminal 20, P channel FET 17 connects slew rate control capacitor 18 to the terminal VDD of the system power supply 21, and the capacitor 18 operates as a conventional decoupling capacitor for power supply 21.

In essence, the preferred embodiment of FIG. 1 utilizes the capacitor 18 to reduce slew rate, or alternatively to provide decoupling for power supply 21, providing two functions for the slew rate control capacitor 18 and maintaining circuit layout efficiency.

Figure 3:
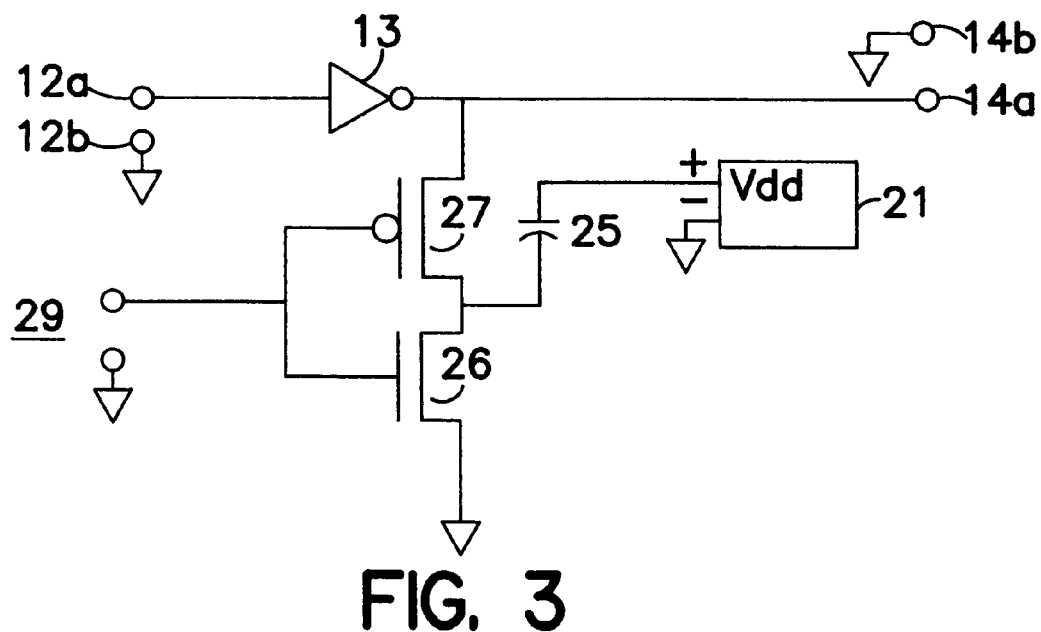
FIG. 3 represents an embodiment of the invention where the slew rate control capacitor decouples the power supply through an N channel field effect transistor.

FIG. 3 illustrates an alternative embodiment wherein the slew rate capacitor 25 is connected through the N channel FET 26 to ground as a decoupling capacitor. The slew rate control is effected by applying a control pulse to control terminal 29, rendering P channel FET 27 conducting and N channel FET 26 nonconducting, connecting the formerly grounded side of slew rate control capacitor 25 to the data line 14.

Figure 4:
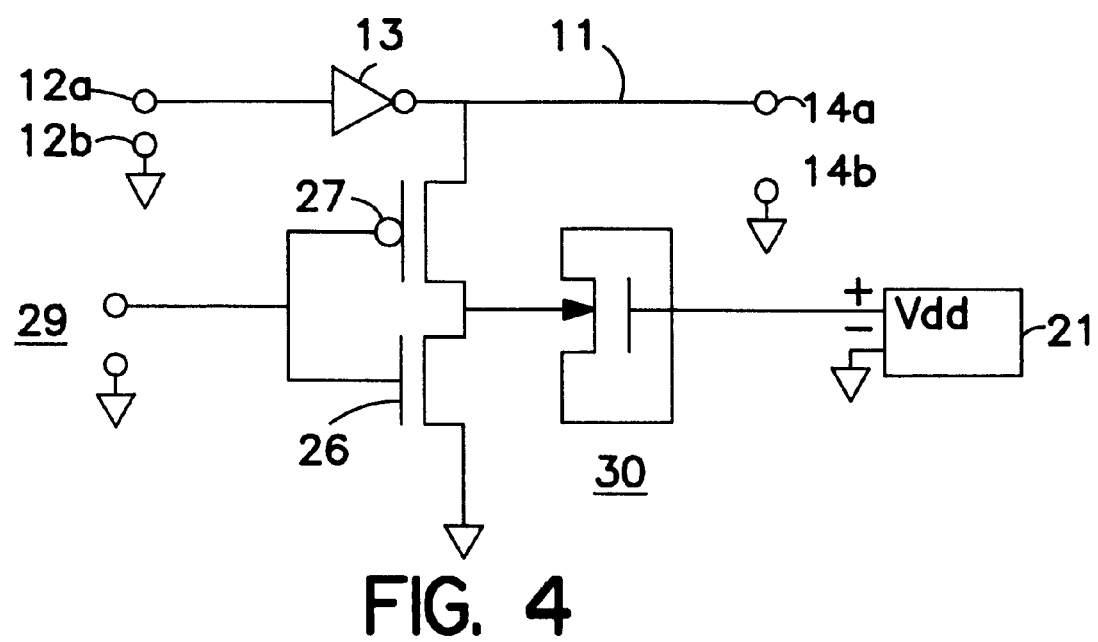
FIG. 4 illustrates the slew rate control device in accordance with another embodiment of the invention wherein the slew rate control capacitor is implemented with an accumulation capacitor.

In yet another embodiment of the invention, shown in FIG. 4, the slew rate control capacitor 18 is an accumulation capacitor 30. Accumulation capacitor 30 is implemented by locating an N channel FET within an N well on the substrate.

Figure 5:
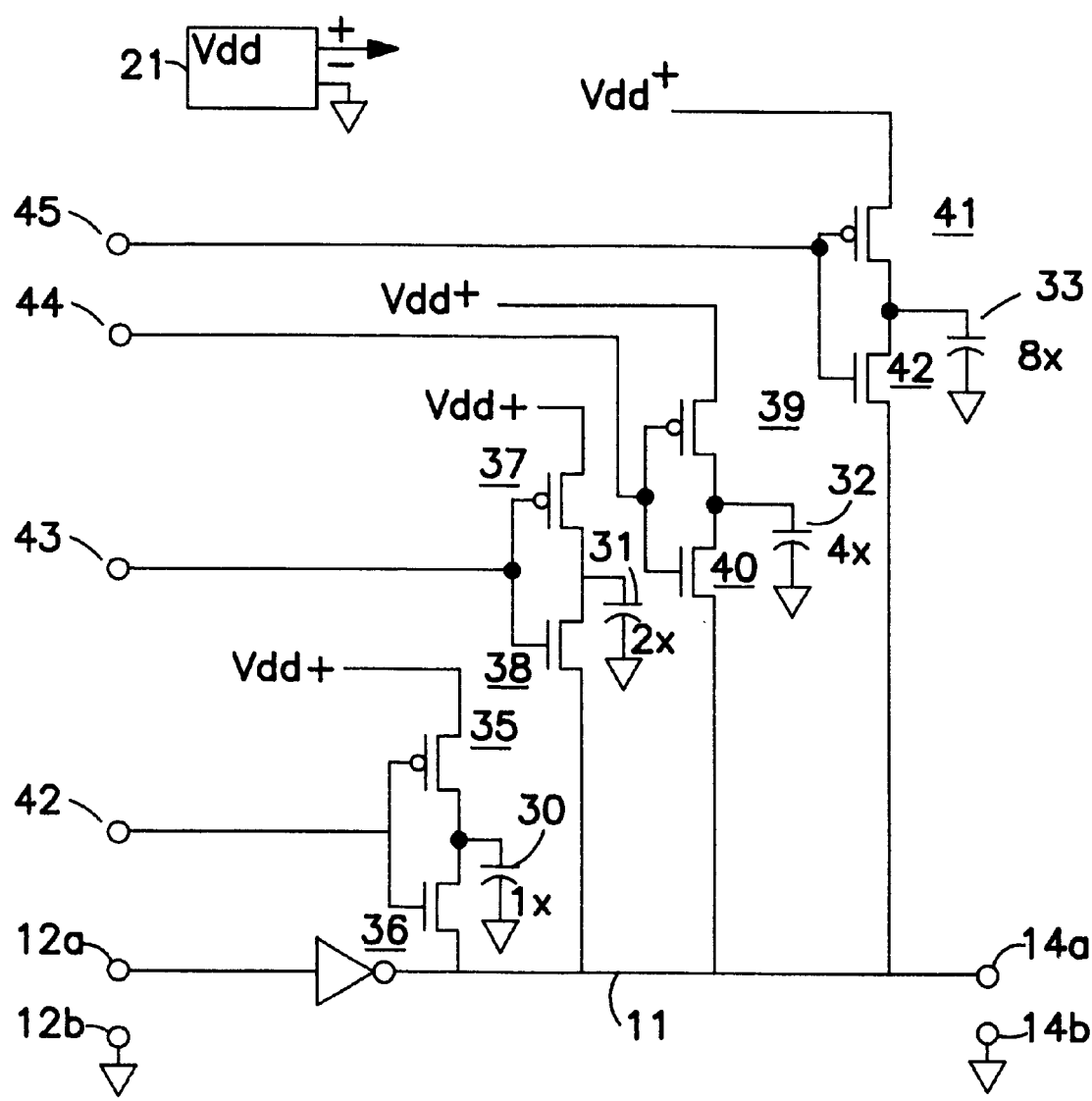
FIG. 5 illustrates an embodiment of the invention for changing the slew rate of a digital signal in multiple steps.

In accordance with yet another embodiment of the invention, FIG. 5 illustrates an implementation of the basic slew rate control device for selectively controlling slew rate in binary steps. The data line 11 is connected to a plurality of slew rate control capacitors 30, 31, 32 and 33 through a respective N channel FET 36, 38, 40 and 42. The slew rate capacitors have values which are binary multiples. P channel transistors 35, 37, 39 and 41 connect the slew rate control capacitors 30, 31, 32 and 33 to one terminal of the power supply 21.

A binary slew rate control is derived when each of the control terminals 42, 43, 44 and 45 are connected to a decoder which selectively enables an N FET 36, 38, 40 or 42 to add the value of capacitors 30, 31, 32 and 33 to the data line 11. The size of the slew rate control capacitor doubles each time a control terminal receives an enabling pulse. Thus, the slew rate of the data on data line 11 can be controlled in finite steps.

The slew rate control provided by the invention may be implemented in digital lock loop (DLL) circuits, self-resetting circuits, sense and delay chains, as well as other conventional circuit implementations.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A circuit for selectively controlling the slew rate of a signal comprising:

a data line connected to receive said signal;

a capacitor having one end connected to a common terminal; and a switching circuit connected to said data line and a second end of said capacitor comprising first and second field effect transistors connected in series and having gate connections connected in common, said series connected transistors being connected between said data line and a voltage terminal, of a voltage source, said capacitor second end connected to a junction formed between said series of transistors, said switching circuit connecting said data line to said capacitor in response to a first state of a control pulse whereby said data line is capacitively loaded increasing the slew rate of said signal.

2. The circuit for selectively controlling the slew rate of a signal according to claim 1 wherein said capacitor is an accumulation capacitor.

3. The circuit for selectively controlling the slew rate of a signal according to claim 1 wherein said first transistor is an NFET type field effect transistor.

4. The circuit for selectively controlling the slew rate of a signal according to claim 1 wherein said second transistor is a PFET type field effect transistor.

5. The circuit for selectively controlling the slew rate of a signal according to claim 1 wherein said switching circuit connects said capacitor second end to a power supply terminal in response to a second state of said control pulse.

6. A circuit for selectively controlling the slew rate of a signal comprising:

a data line for receiving said signal;

a capacitor having one end connected to a first terminal of a power supply; and a switching circuit connected to a second end of said capacitor, to said data line, and to a second terminal of said power supply, said switching circuit operating in response to a first state of a control pulse to connect said capacitor second end to said data line reducing the slew rate of said signal on said data line.

7. The circuit for selectively controlling the slew rate of a signal according to claim 6 wherein said switching circuit connects said capacitor second end to said power supply second terminal in response to a second state of said control pulse.

8. The circuit for selectively controlling the slew rate of a signal of claim 6 wherein said capacitor is an accumulation capacitor.

9. A circuit for selectively controlling the slew rate of a signal comprising:

a data line for carrying said signal;

a first capacitor connected at one end to a first terminal of a power supply;

a second capacitor connected at one end to the first terminal of a power supply;

a first switching circuit connected to a second end of said first capacitor, said data line, and a second terminal of said power supply, said first switching circuit connecting said capacitor second end to said data line in response to a first state of a first control signal; and a second switching circuit connected to a second end of said second capacitor, said data line, and the second terminal of said power supply, said second switching circuit connecting said second capacitor second end to said data line in response to a first state of a second control signal.

10. The circuit for selectively controlling the slew rate of a signal according to claim 9 wherein said first and second capacitors have different values of capacitance.

11. The circuit for selectively controlling the slew rate of a signal according to claim 9 wherein said first and second switching circuits connect said first and second capacitors to said second terminal of said power supply in response to a second state of said first and second control signals.

12. The circuit for selectively controlling the slew rate of a signal according to claim 9 wherein said capacitors have a value of capacitance which is in the ratio of two to one.

13. The circuit for selectively controlling the slew rate of a signal according to claim 9 comprising:

a third capacitor having one end connected to said first terminal of said power supply;

a fourth capacitor having one end connected to said first terminal of said power supply;

a third switching circuit connected to a second end of said third capacitor, said data line, and the second terminal of said power supply, said third switching circuit connecting said third capacitor second end to said data line in response to a first state of a third control signal; and a fourth switching circuit connected to a second end of said fourth capacitor, said data line, and a second terminal of said power supply, said fourth switching circuit connecting said fourth capacitor second end to said data line in response to a first state of a fourth control signal.

14. The circuit for controlling the slew rate of a signal according to claim 13 wherein said first, second, third and fourth capacitors have capacitances which have a binary ratio with each other.

\* \* \* \* \*